United States Patent
Eaton et al.

(10) Patent No.: US 6,854,096 B2
(45) Date of Patent: Feb. 8, 2005

(54) OPTIMIZATION OF CELL SUBTYPES IN A HIERARCHICAL DESIGN FLOW

(75) Inventors: Frederik Eaton, Pasadena, CA (US); Peter Beerel, Encino, CA (US)

(73) Assignee: Fulcrum Microsystems, Inc., Calabasas Hills, CA (US)

(*) Notice: Subject to any disclaimer, the term of this patent is extended or adjusted under 35 U.S.C. 154(b) by 0 days.

(21) Appl. No.: 10/620,330

(22) Filed: Jul. 14, 2003

(65) Prior Publication Data

US 2004/0103377 A1 May 27, 2004

Related U.S. Application Data

(63) Continuation-in-part of application No. 10/354,272, filed on Jan. 28, 2003.
(60) Provisional application No. 60/404,359, filed on Aug. 15, 2002.

(51) Int. Cl.[7] .............................................. G06F 17/50
(52) U.S. Cl. ...................... 716/2; 716/1; 716/6; 716/17
(58) Field of Search .......................... 712/211; 710/36; 703/14; 438/17; 368/113; 365/230.06, 149; 327/379, 264, 172, 157, 112, 108; 326/98; 716/1, 2, 4, 5, 6, 7, 8, 9, 10, 11, 17, 18; 714/724; 713/500

(56) References Cited

U.S. PATENT DOCUMENTS

| | | | |
|---|---|---|---|
| 5,050,091 A | * 9/1991 | Rubin .......................... 716/10 |
| 5,341,041 A | * 8/1994 | El Gamal ..................... 326/44 |
| 5,469,367 A | 11/1995 | Puri et al. |
| 5,493,505 A | 2/1996 | Banerjee et al. |
| 5,519,344 A | 5/1996 | Proebsting |
| 5,553,276 A | 9/1996 | Dean |
| 5,568,062 A | 10/1996 | Kaplinsky |
| 5,752,070 A | 5/1998 | Martin et al. ................. 712/33 |
| 5,790,415 A | * 8/1998 | Pullela et al. .................. 716/6 |
| 5,832,303 A | 11/1998 | Murase et al. ................ 710/36 |
| 6,038,656 A | 3/2000 | Martin et al. ............... 712/211 |
| 6,043,674 A | * 3/2000 | Sobelman ..................... 326/35 |
| 6,044,061 A | 3/2000 | Aybay et al. ............... 370/230 |
| 6,131,182 A | 10/2000 | Beakes et al. |
| 6,216,255 B1 | 4/2001 | Ito et al. |
| 6,226,774 B1 | 5/2001 | Sawasaki et al. |
| 6,263,478 B1 | 7/2001 | Hahn et al. |
| 6,445,065 B1 | * 9/2002 | Gheewala et al. .......... 257/691 |
| 6,449,757 B1 | * 9/2002 | Karniewicz .................... 716/7 |
| 6,591,407 B1 | 7/2003 | Kaufman et al. |

(List continued on next page.)

OTHER PUBLICATIONS

Laberge et al., "An asynchronous FIFO with fights: sace study in speed optimization", Dec. 17–20, 2000, ICECS 2000, Th 7–th IEEE International Conference, vol. 2, pp.: 755–758.*

(List continued on next page.)

Primary Examiner—Vuthe Siek
Assistant Examiner—Helen Rossoshek
(74) Attorney, Agent, or Firm—Beyer Weaver & Thomas LLP

(57) ABSTRACT

Methods and apparatus are described for facilitating physical synthesis of a circuit design. The circuit design includes a plurality cell instances organized hierarchically. Each cell instance corresponds schematically to one of a plurality of cell types. Transistors in each of the cell instances is sized with reference to an objective function thereby resulting in a first plurality of cell subtypes for each cell type. Each cell subtype corresponding to a particular cell type differs from all other cell subtypes corresponding to the particular cell type by at least one transistor dimension. Selected ones of the subtypes for at least one of the cell types are merged thereby resulting in a second plurality of subtypes for the at least one of the cell types. The second plurality of subtypes being fewer than the first plurality of subtypes. The merging of the selected subtypes achieves a balance between the objective function and a cost associated with maintaining the selected subtypes distinct.

34 Claims, 8 Drawing Sheets

U.S. PATENT DOCUMENTS

| | | | |
|---|---|---|---|
| 6,609,227 B2 * | 8/2003 | Bradley et al. | 716/1 |
| 6,643,828 B2 * | 11/2003 | Naffziger et al. | 716/2 |
| 6,694,491 B1 * | 2/2004 | Osann et al. | 716/2 |
| 2001/0032329 A1 * | 10/2001 | Lee et al. | 716/6 |
| 2002/0023255 A1 * | 2/2002 | Karniewicz | 716/17 |
| 2003/0146773 A1 | 8/2003 | Bobba et al. | |

OTHER PUBLICATIONS

Andrew Matthew Lines, *Pipelined Asynchronous Circuits*, Jun. 1995, revised Jun. 1998, pp. 1–37.

Alain J. Martin, *Compiling Communicating Processes into Delay–Insensitive VLSI Circuits*, Dec. 31, 1985, Department of Computer Science California Institute of Technology, Pasadena, California, pp. 1–16.

Alain J. Martin, *Erratum: Synthesis of Asynchronous VLSI Circuits*, Mar. 22, 2000, Department of Computer Science California Institute of Technology, Pasadena, California, pp. 1–143.

U.V. Cummings, et al. *An Asynchronous Pipelined Lattice Structure Filter*, Department of Computer Science California Institute of Technology, Pasadena, California, pp. 1–8.

Alain J. Martin, et al., *The Design of an Asynchronous MIPS R3000 Microprocessor*, Department of Computer Science California Institute of Technology, Pasadena, California, pp. 1–18.

C.L. Seitz, *System Timing*, chapter 7, pp. 218–262.

F.U. Rosemberger et al., *Internally Clocked Delay–Insensitive Modules*, IEEE Trans., Computers, vol. 37, No. 9, pp. 1005–1018, Sep. 1998.

U.S. Appl. No. 09/501,638, filed on Feb. 10, 2000, entitled, *Reshuffled Communications Processes in Pipelined Asynchronous Circuits*.

Lee et al., *Crossbar–Based Gigabit Packet Switch with an Input–Polling Shared Bus Arbitration Mechanism*, Sep. 21, 1997, XVI World Telecom Congress Proceedings, Interactive Session 3—Systems Technology & Engineering, pp. 435–441.

Ghosh et al., *Distributed Control Schemes for Fast Arbitration in Large Crossbar Networks*, Mar. 1994, IEEE Transactions on Very Large Scale Integration (VLSI) Systems, vol. 2, No. 1, pp. 55–67.

Yu et al., "A New Approach for Checking the Unique State Coding Property of Signal Transition Graphs", Mar. 1992, Design automation, European conference, IEEE, pp. 312–321.

* cited by examiner

*SizingPathGeneration*(set1)

foreach leaf cell cella in set1 find all the half-operators in cella that are going to start a path, put in seta foreach half-operator hoa in seta lsta is an empty list of half-operators

RecursivePaths(lsta, hoa)

*RecursivePaths*(lst1, ho1)

If (lst1 contains ho1) make sizing-path from lst1, then return     // found cycle If (ho1 drives an observable point) make sizing-path from lst1 and ho1, then return foreach hoa that is driven by ho1 and has opposite driving direction of ho1

RecursivePaths(lst1+ho1, hoa)

*CatPathGeneration*(set1)

lsta is sorted list of mid-level cells in set1, from low to high (e.g. from mid to top levels)

foreach cella in lsta

// N.B. an nonobservable sucells is a subcell which contains

// a nonobservable point pop up paths from nonobservable subcells of cella to cella find all the paths in cella that are going to start a cat-path, put in seta foreach patha in seta lsta is an empty list of paths

RecursiveCatPaths(lsta, patha)

*RecursiveCatPaths*(lst1, path1)

if (lst1 contains path1) make cat-path from lst1, then return     // found cycle if (last half-operator of path1 drives an observable point)

make cat-path from lst1 and path1, then return foreach patha that is driven by path1

RecursiveCatPaths(lst1+path1, patha)

Fig. 4

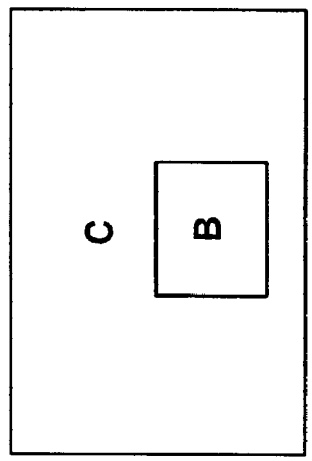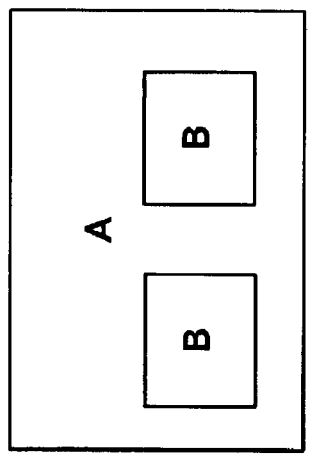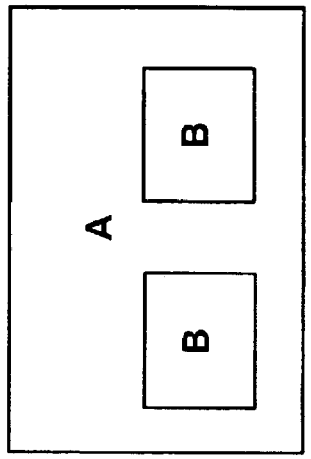
Fig. 7

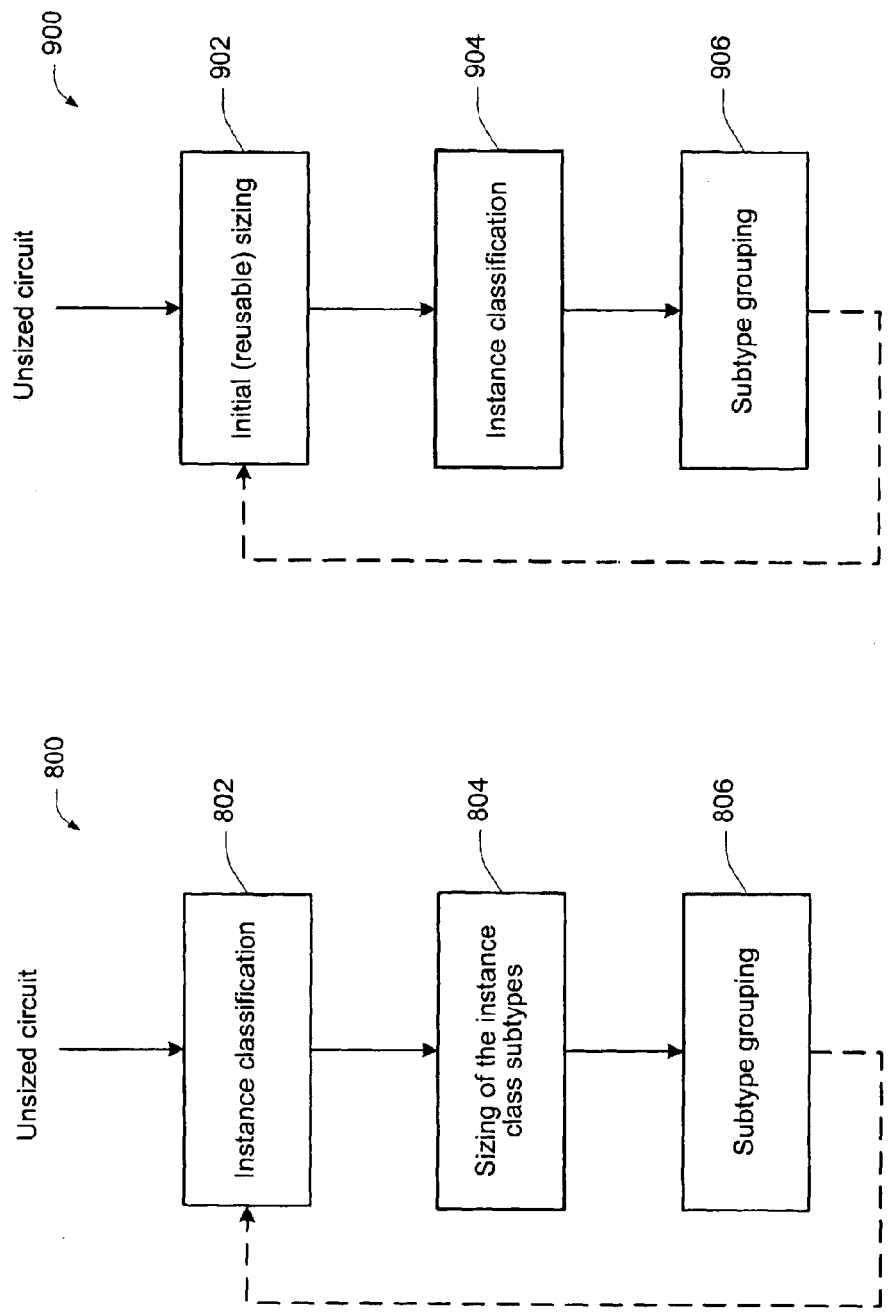

OPTIMIZATION OF CELL SUBTYPES IN A HIERARCHICAL DESIGN FLOW

RELATED APPLICATION DATA

The present application claims priority from U.S. Provisional Patent Application No. 60/404,359 entitled P2N SIZING TOOL-PATH BASED SIZING filed on Aug. 15, 2002, the entire disclosure of which is incorporated herein by reference for all purposes. The present application is a continuation-in-part of U.S. patent application Ser. No. 10/354,272 for METHODS AND APPARATUS FOR FACILITATING PHYSICAL SYNTHESIS OF AN INTEGRATED CIRCUIT DESIGN filed on Jan. 28, 2003, the entire disclosure of which is incorporated herein by reference for all purposes.

BACKGROUND OF THE INVENTION

The present invention relates generally to the design of integrated circuits and, more specifically, to software tools for sizing various elements of an integrated circuit design. Still more specifically, the present invention provides techniques for generating an appropriate number of leaf cell subtypes in a hierarchical design to achieve a particular set of design goals.

The problem of transistor sizing in an integrated circuit design may be stated as follows: given an initial circuit and floor planning (i.e., geometry) information, generate an improved circuit by changing transistor widths such that the improved circuit meets delay constraints, and minimizes objective functions, e.g., energy dissipation or area. Generally speaking, the optimal layout for a particular circuit design would result from an approach in which every transistor is allowed to size independently. However, such an approach would result in too many cells that would have to be laid out. On the other hand, allowing too few cell types or primitives from which to create such a circuit design makes it difficult to meet the delay constraints and to minimize the objective functions.

It is therefore desirable to provide tools for use in the design of integrated circuits which address these issues and strike the appropriate balance for a given application.

SUMMARY OF THE INVENTION

According to the present invention, methods and apparatus are provided for facilitating physical synthesis of an integrated circuit design. More specifically, a variety of techniques are provided by which the number of cell subtypes for a given circuit design may be optimized to achieve a desired balance between circuit area savings and the layout costs associated with the introduction of additional subtypes.

According to various embodiments, the circuit design includes a plurality of cell instances organized hierarchically. Each cell instance corresponds schematically to one of a plurality of cell types. Transistors in each of the cell instances are sized with reference to an objective function thereby resulting in a first plurality of cell subtypes for each cell type. Each cell subtype corresponding to a particular cell type differs from all other cell subtypes corresponding to the particular cell type by at least one transistor dimension. Selected ones of the subtypes for at least one of the cell types are merged thereby resulting in a second plurality of subtypes for the at least one of the cell types. The second plurality of subtypes being fewer than the first plurality of subtypes. The merging of the selected subtypes achieves a balance between the objective function and a cost associated with maintaining the selected subtypes distinct.

A further understanding of the nature and advantages of the present invention may be realized by reference to the remaining portions of the specification and the drawings.

BRIEF DESCRIPTION OF THE DRAWINGS

FIG. 2 provides pseudo-code representing an exemplary implementation of an intracell path generation algorithm.

FIG. 4 provides pseudo-code representing an exemplary implementation of a path concatenation algorithm.

FIG. 7 is a simplified block diagram for illustrating relationships between cell subtypes, instances, and instance classes.

FIG. 8 is a flowchart illustrating a first subtyping algorithm designed according to the invention.

FIG. 9 is a flowchart illustrating a second subtyping algorithm designed according to the invention.

DETAILED DESCRIPTION OF SPECIFIC EMBODIMENTS

Figure 1:
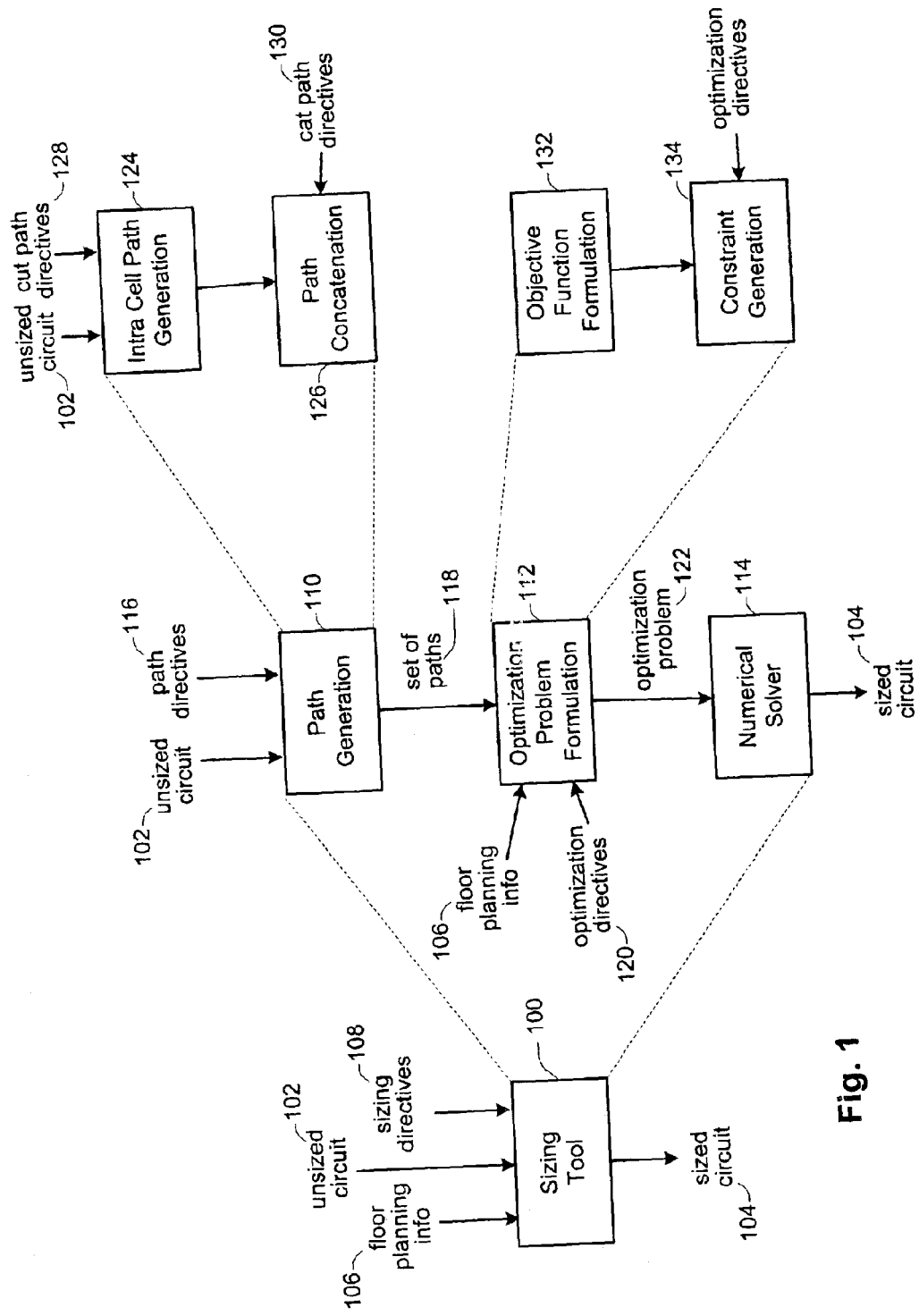
FIG. 1 is a simplified block diagram of a transistor sizing tool which may be used with specific embodiments of the present invention.

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

It should be noted that the embodiments of the invention described below have been implemented using Java in a GNU/Linux operating system platform. However, it will be understood that embodiments may be implemented using any of a wide variety of software languages and computing platforms without departing from the scope of the invention. For example, one could use C or C++ on a Windows or SUN OS platform.

It should also be noted that specific embodiments of the invention are described in the context of a design style relating to quasi-delay-insensitive asynchronous VLSI circuits. However it will be understood that many of the principles and techniques of the invention may be used in other contexts such as, for example, non-delay insensitive asynchronous VLSI as well as synchronous VLSI.

Specific embodiments of the invention will be described in the context of an asynchronous design style which is characterized by the storing of data in channels instead of registers. Such channels implement a FIFO (first-in-first-out) transfer of data from a sending circuit to a receiving circuit. Data wires run from the sender to the receiver, and an enable (i.e., an inverted sense of an acknowledge) wire goes backward for flow control. A four-phase handshake between neighboring circuits (processes) implements a channel. The four phases are in order: 1) Sender waits for high enable, then sets data valid; 2) Receiver waits for valid data, then lowers enable; 3) Sender waits for low enable, then sets data neutral; and 4) Receiver waits for neutral data, then raises enable. It should be noted that the use of this design style and this handshake protocol is for illustrative purposes and that therefore the scope of the invention should not be so limited.

According to other aspects of this design style, data are encoded using 1ofN encoding or so-called "one hot encoding." This is a well known convention of selecting one of N+1 states with N wires. The channel is in its neutral state when all the wires are inactive. When the kth wire is active and all others are inactive, the channel is in its kth state. It is an error condition for more than one wire to be active at any given time. For example, in certain embodiments, the encoding of data is dual rail, also called 1of2. In this encoding, 2 wires (rails) are used to represent 2 valid states and a neutral state. According to other embodiments, larger integers are encoded by more wires, as in a 1of3 or 1of4 code. For much larger numbers, multiple 1ofN's may be used together with different numerical significance. For example, 32 bits can be represented by 32 1of2 codes or 16 1of4 codes.

According to other aspects of this design style, the design includes a collection of basic leaf cell components organized hierarchically. The leaf cells are the smallest components that operate on the data sent using the above asynchronous handshaking style and are based upon a set of design templates designed to have low latency and high throughput. Examples of such leaf cells are described in detail in "Pipelined Asynchronous Circuits" by A. M. Lines, *Caltech Computer Science Technical Report* CS-TR-95-21, Caltech, 1995, the entire disclosure of which is incorporated herein by reference for all purposes. These leaf cells include the Precharged-Half-Buffer Template, the Weak-Conditioned Half-Buffer Template, and the Precharged-Full-Buffer Template. They are all characterized by having one or two completion detection units, domino logic for the generation of data, and a small number of asynchronous control circuitry controlling when to pre-charge/evaluate the domino logic and when to assert/de-assert the acknowledgement of input channels.

One characteristic unique to this design style is that the cycle time of the design is largely fixed, e.g., 18 gate delays. If each gate delay has a unit-delay, the cycle time of any digitally-performance-optimized circuit designed using these templates will be dictated by cycles of gates, where each cycle generally contains the same number gates (e.g., 18). This makes the overall task of transistor-sizing very straight-forward, i.e., design each transistor such that no cycle of gates exceeds the desired speed target.

In some cases, the above-mentioned asynchronous design style may employ the language CSP (concurrent sequential processes) to describe high-level algorithms and circuit behavior. CSP is typically used in parallel programming software projects and in delay-insensitive VLSI. Applied to hardware processes, CSP is sometimes known as CHP (for Communicating Hardware Processes). For a description of this language, please refer to "Synthesis of Asynchronous VLSI Circuits," by A. J. Martin, DARPA Order number 6202. 1991, the entirety of which is incorporated herein by reference for all purposes.

The transformation of CSP specifications to transistor level implementations for use with various techniques described herein may be achieved according to the techniques described in "Pipelined Asynchronous Circuits" by A. M. Lines, incorporated herein by reference above. However, it should be understood that any of a wide variety of asynchronous design techniques may also be used for this purpose.

Generally speaking, the present invention enables an integrated circuit designer to strike a balance between the minimization of objective functions (e.g., area and power dissipation) on the one hand, and appropriate limitations on the proliferation of cell subtypes on the other. That is, the present invention facilitates appropriate sizing of transistors in an integrated circuit design, while taking into account the cost of introducing additional cell subtypes. At the outset, it should be noted that the present invention may be used with a wide variety of design styles and tools, and that references to specific design styles and tools herein are made merely for illustrative purposes. The scope of the invention should therefore not be limited thereby.

A specific embodiment of the present invention may employ a sizing tool that can handle loops, support dynamic logic, and can independently size pull-up and pull-down networks in a hierarchical design flow with extensive re-use. As will become clear, this feature is particularly advantageous in relation to circuits designed according to the asynchronous design style described above. According to a specific implementation, gates along the same path are allowed to trade-off delay amongst each other, i.e., path-based delay budgeting. That is, according to such an implementation, the sizing tool meets delay constraints for a given sequence of transitions rather than on a per transition basis, the delay through the sequence of transitions adding up to the same delay as if each of the transitions has a unit delay associated with it. This sizing tool can also independently size transistors driving rising and falling transitions, therefore increasing the solution space and producing better circuits. According to various implementations, sizing tools for use with the present invention may also facilitate making tradeoffs between size, speed, and power consumption.

In a hierarchical design flow with extensive design re-use, path generation is particularly complex. This is because in such a hierarchical design flow many instances of cells with the same cell type are used. The transistor sizes are associated with transistors in a cell type and all instances of that cell type must share the same assignment of transistor sizes. This ensures the physical layout of the cell type can be re-used for each instance. For this reason, the computation of all paths that are important to each cell type must consider all different types of paths that relate to any transistor in the cell type. The paths must constrain the transistor sizes considering all the different instances in which the cell type is used and take into account the fact that different paths through this cell exist for different instances of its use.

At the same time, the path generation should not operate solely considering cell instances for two reasons. First, many cell instances share the same environment and thus the related paths are redundant with other cell instances. Second, the path generation must recognize that portions of different paths in different portions of the circuit cross instances of the same cell type to ensure that the transistor sizes within different instances of the same cell type are the same. Thus, it is important to consider all non-redundant paths considering all environments of a cell and ensure that the all such constraints are placed on the sizes of the transistors associated with each cell type. This type of path generation is not considered in any other known transistor-sizing tool. Path generation for digitally-performance-optimized asynchronous circuits designed according to the above-described design style amounts to breaking up all cycles into a set of paths that form the basis of the transistor sizing constraints needed to size the transistors in every leaf cell type.

In addition to providing path-based delay budgeting, a specific implementation of the sizing tool allows the designer to size a circuit without regard to a test case that would define the critical paths in the circuit. That is, the circuit is sized to have effectively unit delay, i.e., to behave as if each gate has on average unit delay. This is in contrast to those tools that allocate the delay of each gate based on test cases that in some way provide a notion of the criticality of each gate. This sizing tool has a great deal of flexibility to optimize transistor/gate sizes as long as it doesn't change the observable performance characteristics of the circuit. This is advantageous in that it allows the designer to do all digital level simulations assuming unit delays, as well as all performance optimizations at the digital level. The sizing tool then enforces these optimizations at the analog level, determining the optimal devices sizes under those constraints. This approach avoids the difficult problem of devising a reasonable test case, and is thus more robust with regard to user error than approaches that require such a test case. This is particularly advantageous in the quasi-delay-insensitive design flow discussed above where by design most, if not, all the critical paths have the same number of digital transitions, i.e. gate delays.

A particular implementation of a sizing tool for use with the present invention will now be described with reference to the accompanying figures. It will be understood that specific features described below are intended to be exemplary and should not be construed to limit the scope of the invention. Referring now to FIG. 1, sizing tool 100 is a tool for physical synthesis that includes a number of different algorithms. The primary input to the tool is an unsized representation of a circuit 102, e.g., a SPICE netlist in which the size of the transistors is as yet undetermined. The output of the tool is a sized representation of the same circuit 104, e.g., a SPICE transistor netlist in which the widths of all of the transistors are specified. Floor planning/geometry information 106 and a number of top level sizing directives 108 which control the various functionalities of the tool are also provided as input to the tool.

It should be noted that the unsized transistor level description which the sizing tool receives as its input may be in any of a variety of description languages similar to SPICE which may be generated using any of a variety of design flows, e.g., an asynchronous design flow, conventional synchronous place and route tools, synthesis tools, etc.

According to a specific implementation, floor planning information 106 is initial physical layout information that includes the geometry of the layout, i.e., the relative position and size of all of the different blocks and cells, and specifically the wire lengths of the initial layout. As will be understood, the corresponding information in the output of the sizing tool may be used as floor planning information input for subsequent iterations. The nature of the user directives will be described in greater detail below.

Sizing tool 100 may be conceptually divided into three components, a path generation component 110, an optimization problem formulation component 112, and a numerical solver component 114. The path generation component 110 receives the unsized netlist 102 and a portion of the top-level directives 108 that we will refer to as path directives 116, and generates a set of paths 118. The optimization problem formulation component 112 receives the set of paths 118, the floor planning information 106, and a portion of the top-level directives 108 that we will refer to as optimization directives 120, and generates an optimization problem 122. The numerical solver 114 receives the optimization problem 122 and generates the sized netlist 104.

The path generation component 110 of the sizing tool may be further divided into two components, an intracell path generation component 124 and a path concatenation component 126. The intracell path generation component 124 receives the unsized netlist 102 and a subset of the path directives 116 that we will refer to as the "cut path" directives 128. The path concatenation component 126 receives the output of the intracell path generation component 124 and a subset of the path directives 116 that we will refer to as the "cat path" directives 130, and generates the set of paths 118.

The optimization problem formulation component 112 may also be further divided into two components, an objective function formulation component 132 and a constraint generation component 134. The constraint generation component receives the output of the objective function formulation component and the optimization directives 120 and generates the optimization problem 122. As an example, one optimization directive defines a tolerance that indicates when the optimization result has converged and the tool can terminate.

To achieve the path-based delay budgeting described above, paths within the circuit design are identified. Paths are defined as the circuitry between two observable points in the circuit. According to a specific implementation, the total delay budget along an identified path is a unit delay, referred to as $\tau$, times the number of signal transitions along the path. And because the delay budget is shared among the devices in the path, certain devices, e.g., devices with high fan out, can be slower than others which will pick up the slack. Thus, the sized circuit may have improved energy consumption or area as compared to circuits sized with techniques assigning a unit delay to each device. For the asynchronous design style described above, this guarantees that digitally-performance-optimized circuits designed according that design style will have a cycle time of no worse than $\tau$ times the largest number of gates in any cycle.

According to a specific implementation, the intracell path generation algorithm includes a default strategy for path generation using a depth first search in the portions of the transistor netlist corresponding to the "leaf" or lowest level cells of the design. According to a particular implementation, such cells may have as many as a thousand transistors with the typical leaf cell having around fifty. Such a search involves a traverse from the input ports to the output ports of the cell to identify all possible paths through the cell. The intracell path generation algorithm creates default paths from the inputs of the leaf cell to its outputs and, in cases where a loop exists, cuts the path such that all of the paths generated are without loops. That is, where the search algorithm encounters a previously encountered segment, it terminates the path. The end points of each path are the observable points associated with the leaf cell. Thus, the observable points of a particular leaf cell include its input and output ports as well as the internal nodes at which such cuts were made. In one implementation, the cut-path directive is a list of internal nodes which also should be observable, thereby giving the user more direct control of where paths will be cut.

In one specific implementation, a path is redefined as a sequence of node-transition pairs and an observable point is defined as one such pair. This means that the paths can be identified with a sequence of half-operators, each responsible for pulling-up or pulling-down a node. For example, the pair (x, +) refers to the half-operator driving the node x high. As before, the path constraints require the paths to have amortized unit-delay. The benefit of this implementation is that it allows the pull-up and pull-down transistors to be sized independently, increasing the solution space of the circuit, and enabling better circuits. Pseudo-code 200 representing an exemplary implementation of an intracell path generation algorithm is illustrated in FIG. 2. In a particular implementation, the cut-path directives allow the user to specify a node plus either falling or rising as observable. For convenience, a node alone can be listed as a cut-path directive as a short hand to making both the falling and rising transitions of that node observable.

Figure 3:
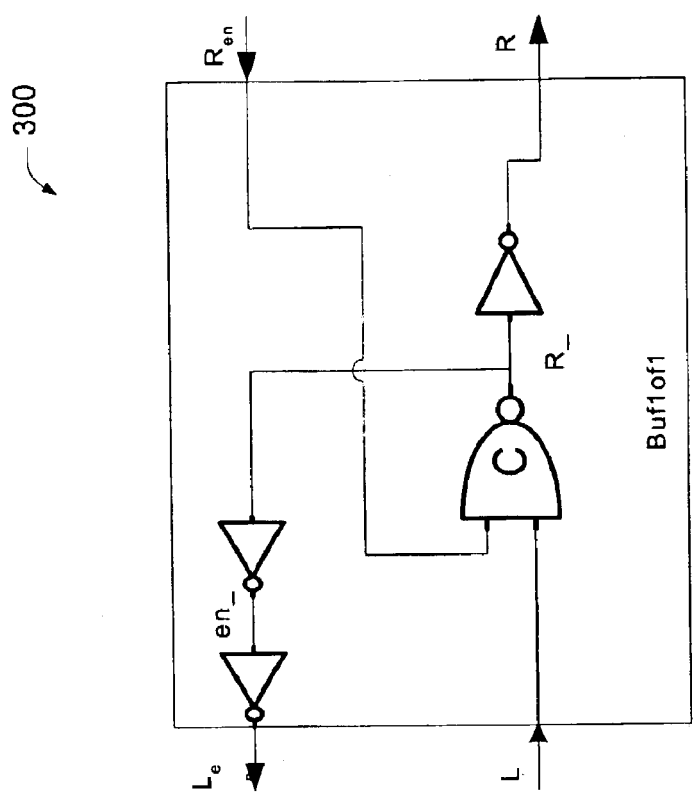
FIG. 3 is a gate level schematic of an exemplary cell for illustrating operation of an intracell path generation algorithm.

As an example of the operation of such an intracell path generation algorithm, consider the gate-level description of a buf1of1 circuit 300 shown in FIG. 3. In this example, the set set1 contains the single cell buf1of1 that is later assigned to the variable cella. The set of half-operators that will start a path are {(L,+), (L,−), (Ren,+),(Ren,−)}, where we denote a half-operator as a pair containing the node name and the direction that the node is driven. The first half-operator is a place holder and will not be used to size any transistors. The remaining half-operators are used to represent the set of transistors driving that node in that direction. For each of these half-operators, the function RecursivePaths is called with an empty set of half-operators lsta that make up the paths starting from the half-operator hoa.

As an example, consider the first call to RecursivePaths for the half-operator hoa assigned to (L,+). Within the foreach statement, the driven half-operator (R_,−) is found that has opposite direction of (L,+). This half-operator is added to the list and the new list is passed into a recursive call to RecursivePaths with (R_,−). Within this recursive call to subsequent half-operators are found (R,+) and (en_,+). Because (R,+) is an observable point, the code knows that the set of half-operators in 1st1 contains half-operators that make up a path that ends in (R,+). Based on this information it identifies and stores the sizing path that starts with (L,+) and ends in (R,+). Similarly, in the recursive call for (en_,+), the code will identify that (en_,+) drives the observable point (L$_{en}$,+) and create a path starting from (L,+) and ending in (L$_{en}$,+). This creates two sizing paths. Calls to the other four original half-operators form another 6 sizing paths, leading to the following 8 paths identified:

1) (L,+), (R_,−), (en_,+), (L$_{en}$,−)
2) (L,−), (R_,+), (en_,−), (L$_{en}$,+)
3) (L,+), (R_,−), (R,+)
4) (L,−), (R_,+), (R,−)
5) (R$_{en}$,+), (R_,−), (en_,+), (L$_{en}$,−)
6) (R$_{en}$,−), (R_,+), (en_,−), (L$_{en}$,+)
7) (R$_{en}$,+), (R_,−) (R,+).
8) (R$_{en}$,−), (R_,+) (R,−).

Note that in this example only transitions on ports are observable points and no cycles are found. Note, however, that the code checks when paths form a cycle and knows to break the cycle, avoiding an infinite loop.

In some cases, the paths identified by the intracell path generation algorithm are undesirably short. That is, in order to benefit from the flexibility afforded by path based delay budgeting, longer paths may be more desirable in some cases. Therefore, the path concatenation algorithm concatenates certain identified paths, i.e., removes the common observable points between the two paths, to create longer paths. Stated another way, a path is a list of transitions in sequence; a "cat" or concatenated path is a sequence of paths. According to a specific implementation, path concatenation is done according to user-directives which specify that all transitions on ports between cells are to be considered unobservable points. The algorithm then concatenates all paths through such unobservable points. Pseudo-code 400 representing an exemplary path concatenation algorithm is shown in FIG. 4.

Figure 5:
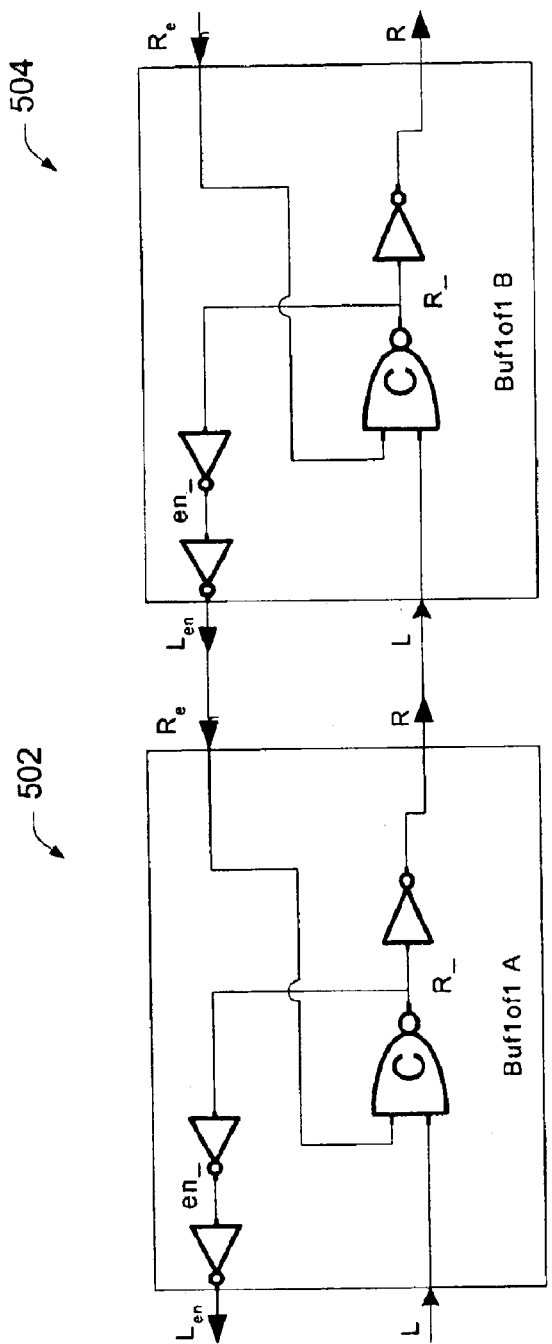
FIG. 5 is a gate level schematic of interconnected cells for illustrating operation of path concatenation algorithm.

As an illustration of the operation of a path concatenation algorithm implemented according to the present invention, consider the example of two connected Buf1of1 circuits 502 and 504 as shown in FIG. 5. Let the notation A.x refer to a node x in Buf1of1 A, and B.x refer to a node x in Buf1o1 B. Consider the case when A.R and B.L are unobservable, and that because of this the paths through the nets are concatenated. The concatenated paths obtained using an algorithm represented by the pseudo-code of FIG. 4 include the following sequences of node-transition pairs:

1) (A.L,+), (A.R_,−), (A.en_,+), (A.L$_{en}$,−)
2) (A.L,−), (A.R_,+), (A.en_,−), (A.L$_{en}$,+)
3) (A.L,+), (A.R_,−), (A.R,+), (B.L,−), (B.R_,+), (B.R,−)
4) (A.L,−), (A.R_,+), (A.R,−), (B.L,+), (B.R_,−), (B.R,+)
5) (A.L,+), (A.R_,−), (A.R,+), (B.L,−), (B.R_,+), (B.en_,−), (B.L$_{en}$,+)
6) (A.L,−), (A.R_,+), (A.R,−), (B.L,+), (B.R_,−), (B.en_,+), (B.L$_{en}$,−)
7) (A.R$_{en}$,+), (A.R_,−), (A.en_,+), (A.L$_{en}$,−)
8) (A.R$_{en}$,−), (A.R_,+), (A.en_,−), (A.L$_{en}$,+)
9) (A.R$_{en}$,+), (A.R_,−), (A.R,+), (B.L,−), (B.R_,+), (B.R,−)
10) (A.R$_{en}$,−), (A.R_,+), (A.R,−), (B.L,+), (B.R_,−), (B.R,+)
11) (A.R$_{en}$,+), (A.R_,−), (A.R,+), (B.L,−), (B.R_,+), (B.en_,−), (B.L$_{en}$,+)
12) (A.R$_{en}$,−), (A.R_,+), (A.R,−), (B.L,+), (B.R_,−), (B.en_,+), (B.L$_{en}$,−)
13) (B.R$_{en}$,+), (B.R_,−), (B.en_,+), (B.L$_{en}$,−)
14) (B.R$_{en}$,−), (B.R_,+), (B.en_,−), (B.L$_{en}$,+)
15) (B.R$_{en}$,+), (B.R_,−), (B.R,+)
16) (B.R$_{en}$,−), (B.R_,+), (B.R,−)

The operation of the algorithm in FIG. 4 is as follows. The CatPathGeneration is called, set1 containing only a single mid-level cell that in this case contains the two Buf1of1 circuits. This single mid-level cell is assigned to the variable cella. First the sizing paths for both Buf1of1 subcells are "popped-up" to the mid-level cell. This amounts to properly annotating each half-operator in the sizing path with the sub-cell instance it belongs to within the mid-level cell. Then, the paths that will start cat-paths are identified. These are the paths that start at observable points of the mid-level cell. In this case, these are the paths that with Buf1of1 A.L and Buf1of1B.R$_{en}$. These two paths are added to the variable seta.

For each of these paths, we use a similar function to RecursivePaths called RecursiveCatPaths to identify the set of paths starting from these paths that can make up cat-paths and drive observable points and make cat-paths from them. As an example, consider the call to RecursiveCatPaths with the path starting with (Buf1of1A.L,+) and ending with (Buf1of1A.R,+). The foreach clause identifes that this path drives two other paths that start with (Buf1of1B.L,+) that in turn are assigned to the variable patha. For each such path, the code recursively calls RecursiveCatPaths. In the recursive call for the path that ends in (Buf1of1B.R,+), the code identifies it drives an observable point and makes a catpath including the pair of sizing paths. In the recursive call for the path that ends in (Buf1of1B.Len+) drives an observable point and creates a catpath including this pair of sizing paths. Note also that the code has a case where the cat-paths forms cycles and knows to break the cycles, avoiding an infinite loop.

As mentioned above, the intracell path generation and path concatenation algorithms employ different portions of the user defined path directives to identify/cut paths and concatenate paths, respectively. That is, the intracell path generation algorithm employs the cut path directives to govern its behavior, and the path concatenation algorithm employs the cat path directives to govern its behavior. According to a specific implementation, the intracell path generation algorithm and the path concatenation algorithm are provided as separate algorithms to take advantage of the fact that the typical circuit design includes a number of instances of particular cell types. Thus, the intracell path generation results for a particular type of cell can be applied to all instances of that cell type in any number of different parent types.

Referring back to FIG. 1, once the set of paths 118 is generated, the objective function formulation algorithm 132 generates an objective function that is a measure of energy and/or area. More specifically and according to various implementations, energy in this context corresponds to a weighted function of all the transistor sizes. According to a particular implementation, the weights are derived from the number of times a particular transistor is used in the circuit. According to alternative implementations, the weights can also be derived with reference to the expected number of transitions on a given transistor. As will be understood, there is a correlation between the latter and the former. However, in some circuits, e.g., asynchronous circuits, the correlation may not be particularly strong as certain portions of such a design may only be executed infrequently. According to still further implementations, the weights may be derived from some combination of both of these factors as well as a variety of other factors.

On the other hand, the number of times a particular transistor is used in a circuit correlates quite well with the overall area dedicated to that type of transistor, i.e., if the size of the transistor can be reduced the impact on the overall circuit area will be proportional to the number of instances of that transistor. Such an approach does not take wiring area into account, but is nevertheless a good approximation.

In addition to the variables which control the sizes of the individual transistors in the gates that make up the leaf cells of the circuit, a delay model is needed which approximates the delay through these gates. This delay model includes a gate delay model, which corresponds to the delay through the gate itself, and a wire delay model that corresponds to the delay through the wire driven by the gate. The delay model is applied to the leaf cell paths to generate a delay for each path as a function of the widths of the associated transistors. This delay is then stored as a constraint that must be met for the corresponding path.

Thus, the optimization problem becomes minimizing the objective function, i.e., energy/area, of independent variables subject to all of the path constraints. This may be done with any of a variety of conventional numerical solvers.

In one specific implementation, the optimization problem given to the numerical solver uses hard delay constraints. This means that the solver will try to minimize energy given delay constraints that all must be satisfied. Consequently, for some circuits with nodes that have high fanout or high resistance due to long wires, the optimization problem may have no solution. The implementation returns information to the user identifying which paths prevented the solver from achieving a set of transistors which satisfies the delay constraints. This enables the circuit designer to make circuit optimizations after which sizing is re-run.

In another implementation, the delay constraints are soft. This can be done by incorporating the difference between delays and their constraints into the objective function and minimizing the amount that the paths delays are larger than their associated constraints.

A particular implementation of a sizing tool for use with the invention employs an operator delay model that represents a transistor as a resistor and solves for the delay of an RC network. According to a more specific implementation, the operator delay model defines a gate as including a pull-up half operator and a pull-down half operator connected at the node of interest. Two constraints for each path are generated, one for each transition, i.e., low-to-high and high-to-low. The corresponding half operator is modeled as a resistor, the load on the node is modeled as a capacitor, and the intervening wire is modeled using a wire $\pi$ model.

Figure 6:
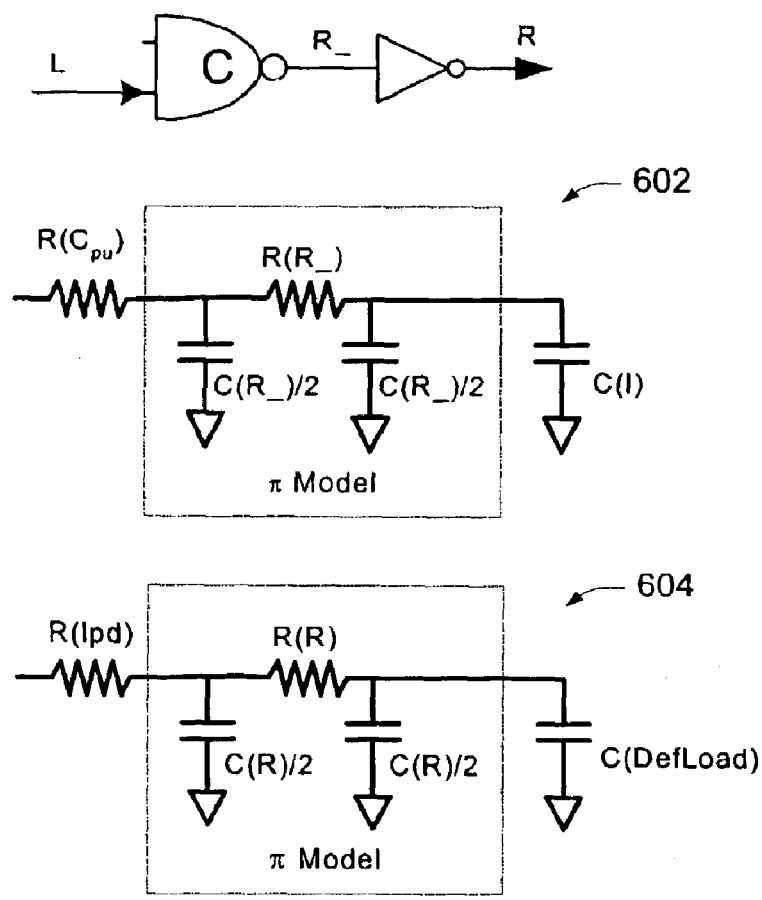
FIG. 6 includes schematics illustrating pull up and pull down half operator representations of a circuit path according to a particular delay model.

As an example, consider the path L, R__, R in the circuit illustrated in FIG. 3. The Mueller consensus element (C-element) gate driving R__ may be represented by a pull-up half-operator and pull-down half-operator, each of which has an associated function for resistance in terms of the width of the associated transistors. Let these functions be denoted $R(C_{pu})$ and $R(C_{pd})$, respectively. Similarly, let the functions for pull-up and pull-down half-operator resistances for the inverter gate in the path be denoted $R(I_{pu})$ and $R(I_{pd})$, respectively. The wires R__ and R have $\pi$ models associated with their resistance and capacitance and let the wire R have an additional default capacitance C(R) associated with it that models potential fanouts. Consequently, each transition in the path has an associated RC network from which a symbolic expression of delay is defined. As an example, the RC networks 602 and 604 for the rising transition of R__ and the falling transition of R are shown in FIG. 6.

There are two path constraints associated with each path, one modeling the rising transition at the output (end of the path) and one modeling the falling transition at the output. These path constraints constrain the sum of the delay associated with the related RC networks to be less than the delay budget defined as a function of $\tau$. According to a specific implementation, the path constraints for a cell take into account all instances of that cell and that different instances will have different wire delays and load capacitance on its output ports. Consequently, the path constraints model the worst-case delay on the path defined to be the maximum delay in any of the cell instance environments.

According to one implementation, the resistor expressions for the gates are obtained using a simple table look-up in which parameters of the expression are associated with transistor stack size. For example, a particular gate might have a maximum stack height of three transistors. The table can have a constant parameter which when multiplied by the transistor widths represents the overall resistances. The delay is thus a function of this constant parameter and the transistor variables. The value of the capacitance in the delay model relates to the capacitance of the circuitry being driven by the node between the half operators. The wire model employs the wire length data from the floor planning/ geometry information to obtain the appropriate wire delay component.

The wire model is an estimation of the total capacitance and resistance of the net. According to a specific implementation, the capacitance is derived from the total wire length of a net connecting many half-operators. This total wire length is generated using a "half the perimeter of the bounding box" approximation algorithm. Such an algorithm defines a bounding box having two devices to be interconnected on diagonally opposite corners. The bounding box having multiple devices is the smallest box that includes all devices. The total wire length connecting these devices is then estimated to be half the distance around the perimeter of the bounding box. Capacitance of the net is then a function of the total wire length and can take into account the estimated side-wall capacitance associated with neighboring wires. This turns out to be give a much better approximation than conventional sizing techniques that do not use hierarchical floor planning information. The resistance of the wire can also be derived from the total wire length. In another implementation, however, the resistance of the net can be estimated to be the maximum of the resistances between any driver and any sink on the net. The resistances between any driver and any sink can be derived using half-the-perimeter of bounding boxes including just the driver and sink or some combination of this distance and half the perimeter of the larger bounding box that includes all drivers and sinks. One such combination is a weighted linear combination that is parameterized by yet another user directive, but other well-known combinations are also possible.

The delay of the resulting RC network is then determined using, for example, classic Elmore delay calculations. According to a specific implementation, these calculations may be modified by taking into account resistive shielding, i.e., the extent to which resistors "shield" the circuit from associated capacitances. The user may introduce the value(s) that effectively model resistive shielding as one or more of the optimization directives. So, for example, for wire lengths exceeding a particular threshold, a resistive shielding factor of less than one can be introduced into the calculation to prevent an overestimation of the delay. According to a more specific implementation, different resistive shielding factors may be provided for different wire lengths.

According to one implementation, the above described operator delay model may apply to all of the fanouts for the node involved. According to various alternative implementation s, more complicated models could be constructed which separately model each fan out. This results in a more accurate delay model, which, in turn, better allows the designer to meet delay constraints with small transistor sizes. For example, this approach is much more accurate than approaches which use estimations of wire lengths based on the total number of gates which need to be placed, and/or only have a limited number of discrete transistor widths available for use. According to various implementations of a sizing tool for use with the invention, the nature of the floor planning information input to such a sizing tool facilitates these efficiencies.

According to a specific embodiment of the invention, the floor planning information provided to the sizing tool is hierarchical in nature. That is, the leaf cells discussed above are the lowest level primitives within a design, i.e., the ones containing transistor level circuitry. There are also typically several higher levels of cells which include various combinations of lower level cells (including leaf cells), and which have associated floor-planning information that is also characterized by a relatively high level of accuracy. That is, because the information is hierarchical, the positions of the leaf cells in higher level cells (and thus across all levels of the design) are more precisely known and therefore the accuracy of the wire lengths provided in the floor planning information is greater.

Thus, the ability to reuse highly accurate primitives on each level of a design that are based on highly accurate lower level primitives (down to the leaf cells), results in a highly accurate and efficient layout. This may be contrasted with conventional techniques, e.g., place and route, which, in addition to the inaccurate wire length estimates discussed above, typically employ flat layouts having a large number of relatively small primitives.

Place and route techniques also suffer from the drawback that they are difficult to iterate with. That is, when the designer employing a place and route tool makes a minor change to the circuit, e.g., to the size of a gate, the resulting layout may have moved the gate to a completely different place in the design. In many cases, this is just like starting over. By contrast, the hierarchical floor planning information employed by the present invention results in a relatively stable layout which allows the designer to make minor changes without dramatically affecting the current layout. In other words, the design flow is more convergent and typically requires fewer iterations than conventional flows.

According to a specific implementation, each of the leaf cells employed by the present invention is significantly larger than the lowest level primitives associated with many conventional techniques. According to one implementation, instead of the conventional 4 to 10 transistors in a typical primitive, e.g., a NAND gate, leaf cells of the present invention may have 50 to 1000 transistors. According to an even more specific implementation, the transistors within a given leaf cell may be (more or less) arbitrarily placed and the wire length estimations within the cell are made using a "half the perimeter of the bounding box" approximation. According to alternative implementations, any of a variety of other wire estimation techniques may be employed including, for example, spanning trees, Steiner trees, Manhattan Steiner trees, etc.

Implicit in the discussion above is the fact that the designer is trying to identify the "best" circuit given some external design constraint. For example, given a fixed power budget, the designer may want to identify the fastest speed at which the circuit can run. Alternatively, given a fixed speed of operation, the designer may want to determine the lowest power dissipation that can be achieved. Thus, according to a particular implementation, a metric that is representative of the overall performance of the circuit is the expression that is optimized by the sizing tool. More specifically, an expression that incorporates energy dissipation and cycle time, e.g., $e\tau^2$, is employed as that metric. It will be understood that any of a wide variety of mathematical combinations of these two parameters may be employed for this purpose. However, the expression $e\tau^2$ is particularly suited to design styles in which circuits are designed to operate over a wide range of supply voltages because it exhibits relative immunity to changes in supply voltage.

Thus, for example, iterations of the sizing technique of the present invention may be run on a given design for different values of $\tau$, i.e., the delay constraints, to determine the minimum energy consumption, i.e., e. Alternatively, a desired value for $e\tau^2$ may be built into the tool.

According to a specific embodiment of the present invention, a sizing tool such as the one described above may be enhanced to include an additional component in which the cell subtypes of the sized netlist are optimized. As will be discussed below, this may involve splitting one cell subtype into multiple subtypes that can be sized independently, optimizing each of them for their own worst-case environments.

For the purposes of the following discussion, a cell type corresponds to all schematically similar cells. "Subtypes" of a particular cell type are schematically similar, but have differently sized transistors. An "instance" is an occurrence of a subtype anywhere in the design. An "instance class" corresponds to all instances of a cell subtype having the same relationship to its immediate parent cell environment. A property of an instance class is that the designer can change the subtype of an instance class without splitting the parent subtype. However, if the designer wants to change the subtype of just one instance of an instance class, the subtype of the parent cell is also changed. An example will be illustrative.

FIG. 7 shows two instances of a parent cell of subtype A and one instance of a subtype C. In each parent cell A there are two instances of a child cell of subtype B. Parent cell C also has an instance of a child cell of subtype B. The left-hand instances of B in parent cells A are part of the same instance class in that each has the same relationship to its external environment. Similarly, the right-hand instances of B in parent cells A both belong to another instance class in that each also has the same relationship to its external environment. On the other hand, the instance of B in parent cell C does not belong to either of these instance classes in that its environment is unique.

If a designer wants to change all of the instances in an instance class, e.g., both of the left-hand instances of B in parent cells A, in the same way, all of the parent cells containing those instances would change in the same way, and thus remain a single subtype, e.g., subtype A. On the other hand, if the designer wants to change only one instance in an instance class, e.g., the left-hand instance of B in the left hand instance of A, the parent cell containing the changed instance would constitute a new subtype, e.g., A'.

If care is not taken in the manner in which particular cell instances in a design are allowed to change, changes to cells higher in the design hierarchy may occur, possibly resulting in the undesirable expenditure of additional physical design and layout resources. Therefore, according to the present invention cell subtype optimization algorithms are provided which take into account both the benefits associated with making changes to a particular instance of a cell subtype, and the costs associated with creation of a new subtype.

FIG. 8 is a flowchart illustrating a specific embodiment of such an optimization algorithm 800. Optimization algorithm 800 receives as its input an unsized circuit which is hierarchical in nature such as, for example, the unsized circuit provided to the sizing tool described above with reference to FIG. 1. The unsized circuit includes a plurality of leaf cells corresponding to a plurality of cell types. According to some embodiments, the input circuit information may be a sized circuit corresponding to a previous sizing iteration. In any case, it should be understood that the nature of the input circuit information may vary considerably and still remain within the scope of the invention. That is, the input to a subtype optimization algorithm implemented according to the present invention may include both sized and unsized asynchronous and synchronous circuit circuits designed according to any of a wide variety of design flows. According to various specific embodiments, the unsized circuit defines the transistors within the circuit that must be sized and the connectivity between the transistors, including the organization of these transistors in the leaf and mid-level cells in the circuit hierarchy. This hierarchical information includes both cell type and cell instance names. The circuit may optionally include any resistive and capacitive parasitic information that affect the performance and area of the circuit that cannot be otherwise deduced from the geometry information inputted along with the circuit netlist.

Initially, the cell instances of each type are partitioned into instance classes (802). As described above, instance classes are all instances of a particular cell type which have the same relationship to their immediate external environment, i.e., their parent cell. Partitioning of cell types into instance classes allows the algorithm to account for changes throughout the hierarchy caused by changes to particular cell instances. It also reduces the complexity of the optimization problem to a function of the number of instance classes rather than a function of the (much larger) number of instances. According to a specific embodiment, the selection of the instance class for a particular cell instance is governed by one or more heuristics and directives. For example, one heuristic may relate to whether or not the cell instance is part of an array. Such a heuristic would favor using a single subtype for the cell instances in the array because of the nearly identical input and output load requirements. One simple heuristic is to subdivide the instance classes so that every unique instance forms an instance class. This creates the largest number of instance classes to size, at both the leaf and mid-levels of cells, but allows the greatest amount of area savings because each instance will be sized ideally for its environment, including cells that it connects to that are outside of its immediate parent. The latter heuristics can be combined to map every unique instance into an instance class except for those cells arrays. Once the cell instances are partitioned into instance classes, the circuit, i.e., each of the cell instances, is sized (804) using any of a variety of sizing tools such as, for example, the sizing tool described above. Because each of the cell instances is sized in this step without regard to the cost of introducing additional cell subtypes, a large number of cell subtypes, i.e., cells of a given type with different transistor sizes, will typically result. As mentioned above, the technique by which the circuit is sized is not particularly relevant to the most fundamental aspects of the invention, and may correspond to any of a wide variety of commercially available and proprietary integrated physical synthesis technologies.

As alluded to above, the designer is constrained by layout and verification resource in the number of subtypes which can be created and be part of the ultimate design. On the other hand, a sufficient number of cell subtypes is desirable to achieve a resonable level of specialization in transister sizes. Therefore, according to a specific embodiment of the invention, the various cell subtypes resulting from the sizing of 804 are grouped or merged with reference to "profit function" (which provides a measure of the benefit to be gained by a particular grouping) to form a smaller set of subtypes (806).

A profit function for use with the present invention may take into account a variety of metrics such as, for example, chip area savings and/or the layout cost associated with the number of subtypes. Different embodiments may consider any or all such metrics, as well as approximations thereof. For example, chip area savings may be determined by performing a test sizing for each grouping decision. Alternatively, to save time, more easily derived rough estimates may be employed. In some exemplary embodiments, layout cost may be ignored. According to others, a rough estimate may be employed.

According to various specific embodiments, a variety of grouping techniques may be employed. According to one such embodiment, potential groupings are determined by evaluating a profit function with reference to the internal similarities of the cell instances in the grouping (e.g., similar transistor sizes). According to another embodiment, the groupings are determined with reference to the external or environmental similarities of the cell instances (e.g., the input and output loads). Such internal or external similarities may be determined with reference to a "distance" function which provides a measure of the "distance" between any two given cell instances of the same type, i.e., how alike or dissimilar the two cell instances are with regard to internal characteristics, external characteristics, or both.

Specific embodiments of grouping algorithms for use with the present invention apply a clustering algorithm to parameterized subtypes. According to these embodiments, a wide variety of distance functions and clustering algorithms may be employed. The purpose of parameterizing the subtypes is to map them into a metric space where "distance" is correlated with cost and benefit of merging distinct subtypes. According to a specific embodiment, the set of parameters used includes transistor sizes calculated from a sizing run in which the subtypes the algorithm is trying to merge are still separate. Additional parameters of interest include, for example, the number of instances of each subtype and the total (possibly estimated) area of all the instances of a subtype.

The use of transistor sizes turns out to be a good parameterization particularly where two subtypes have very close transistor sizes in that very little chip area is lost by merging them into a single subtype. On the other hand, an additional sizing run involving the instance classes is required to determine their transistor sizes which can be expensive where the number of instance classes is large. This increase in complexity can be mitigated by doing multiple classification/grouping runs in such a way that a parent and child type are not processed at the same time. In particular, once the parent types have been fixed, the number of instance classes for the children (or grand-children, etc . . . ) is reduced. Thus, choosing the number of subtypes for mid-level cells first, particularly in a way that does not involve transistor sizing, reduces the number of unique instance classes that must be sized, reducing the complexity of sizing.

As mentioned above, an alternative is to parameterize the subtypes based on the resistive and/or capacitive environments of their external ports. Such an approach (shown in the flowchart of FIG. 9) captures the input and output loads of the instances of the subtypes. This still requires a sizing run (902), but the results of the sizing run can be reused for every type which needs to be subtyped, and the complexity is a function of the number of final subtypes rather than the possibly much larger set of original instance classes of those types. One way to cluster subtypes corresponding to a particular cell type is to set a distance threshold h and maintain a set of "nucleation points" initially containing just one arbitrary subtype. A subtype T which is not a nucleation point is then selected, and it is determined whether T is within h of an existing nucleation point S. If so, then T is grouped with S. Otherwise, T is added to the set of nucleation points. When there are no more free subtypes, the process terminates. The set of nucleation points is made the new subtype set. Additionally, one can ensure that each subtype is assigned to the closest (according to a distance function) nucleation point. This approach guarantees that no two members of the same subtype grouping will be farther than 2 h from each other. And, by adjusting h, some amount of control may be exercised over how many subtypes are created and how much area is sacrificed.

According to various embodiments of the invention, a different distance function may be employed depending on whether the subtype parameterization is based on environmental differences or transistor sizes. In the case of transistor sizes, for example, the distance function can be some arbitrary combination of the average difference in sizes of corresponding transistors, maximum difference of sizes of corresponding transistors, and the number of instances of each subtype. There may also be different distance functions when one of the subtypes corresponds to a fixed-sized cell for which layout already exists. In addition, the thresholds can be different for pairs involving one fixed-sized cell. Alternatively, the distance can also be a function of whether or not one cell is fixed-sized.

A general distance function that has proven useful is:

$$d(R,S)=1/I_T \Sigma_i [(n_R+n_S) \text{size\_est}(R,S,i) - n_R t_i^R - n_S t_i^S - n_R \text{penalty}(S,R,i) - n_S \text{penalty}(R,S,i)] \quad (1)$$

where $I_T$ is the relative layout cost of the type T which has R and S as subtypes, $n_V$ is the number of instances with type V, $t_i^V$ is the size of transistor i of V, size-est is the predicted size of transistor i after merging subtypes R and S, and penalty is the penalty associated with merging a fixed-sized type with a larger type. For a simple implementation, one can set $I_T=1$, size-est$(R,S,i)=\max(t_i^R,t_i^S)$, and penalty$(R,S,i)=0$. For such an implementation of the distance function, the threshold h represents a trade off between cost of layout and gain from area reduction.

Given the thresholds an improved clustering algorithm can be derived using a variety of graph theoretic approaches. In particular, a graph can be generated where each node in the graph reflects one subtype, and an edge between two nodes exists if the distance between the two subtypes meets the threshold(s). Then, the problem of clustering can be transformed into one in which the minimum number of cliques are generated that partition the nodes in the graph. In this case, all members of each partition are within distance h of all other members of the partition. Both optimal and heuristic algorithms to solve this graph problem are well-known and can be applied (see DeMicheli, *Synthesis and Optimization of Digital Circuits*, McGraw-Hill, 1994).

Referring once again to FIG. 9, we will consider the distance function when the parameterization is defined on cell instance environments. In such embodiments, the distance function on which subtype grouping (906) is based can be some combination of differences in the resistive and capacitive environments of each port of the instance. As with the distance function based on transistor differences, this distance function can also be a function of the number of instances of the subtype. In addition, the distance function can be a function of the estimated size of the subtype.

Another approach is to consider partitioning algorithms on the parameterization space such as, for example, clustering based on variants of principal component analysis (PCA) that allow different points in the space to be weighted. According to certain embodiments, these weights can be a function of instance counts. The distance function and or PCA analysis can also take into account the general requirement that the final subtype sizes must satisfy the worst case environment and bias the partition shapes and or clustering algorithm accordingly.

According to various embodiments, the present invention provides both single-pass and iterative implementations. According to one set of single-pass embodiments, instance classification is performed beginning with (and in some cases only for) the leaf cells (i.e., the lowest level) of the hierarchy. As will be understood, this may result in a very large number of subtypes. Therefore, according to another set of iterative embodiments, an iterative, top-down approach is employed which reduces the number of subtypes generated.

In single-pass embodiments (e.g., algorithms 800 and 900 of FIGS. 8 and 9), instance classification defines a minimal set of subtypes and can be guided by splitting directives provided by the user. In particular, the user can place a directive on a cell to indicate whether or not it can or should be split. This is useful to reduce the number of subtypes that must be sized in the subsequent sizing run (e.g., 804). An example of a constraint that can be applied is that cells that are arrayed should not be splittable as this creates more work during the physical design of these cells.

According to a specific embodiment, when a directive states that a cell is to be split, then new instance classes for each of its children are created, one for each of the newly generated parent subtypes. This increases the space of optimization for the children subtypes at the cost of increasing the number of instance classes to be sized. In embodiments employing a hierarchy with word-level and byte-level cells, one heuristic is to split all word-level cells and below in the type hierarchy which allows maximal consideration of the impact of the different global environments for these cells. This heuristic can be combined with the heuristic described above by splitting all word-level cells and below while excluding cells in arrays.

The sizing run then generates transistor sizes for all these subtypes from which the parameterization space is defined and upon which clustering can be applied. Clustering based on greedy algorithms, clique-covering algorithms, or PCA variants can all be applied. In both greedy and clique-covering approaches, adjusting the threshold h provides a basis to trade-off the number of new subtypes and the reduction in area required. Having the distance be a function of instance counts as in Eq. (1) may provide a better tradeoff between these competing concerns. That is, subtypes with fewer instances may be considered to have shorter distances, enabling fewer subtypes to be assigned to such instances. Thus, even though the instances will be larger than if more subtypes were allocated, the impact in area is small since the relative number of instances in these subtypes is small. Extending this algorithm to consider energy reduction rather than area reduction is relatively straight-forward for the skilled designer.

As an alternative to the single-pass approaches discussed above, various iterative embodiments of a subtyping algorithm are provided. This is indicated by the dashed lines in FIGS. 8 and 9. According to one such embodiment, the algorithm works from the top of the hierarchy down, fixing each detail as late as possible. For example, rather than computing a set of subtype assignments at the same time as we compute the number of subtypes of a type, such an approach might first choose a subtype count and then, taking that number as fixed, try to find the best set of assignments. This may be accomplished, for example, with a special clustering algorithm taking a number of subtypes as input, or with repetitions of one of the algorithms presented above, varying a controlling parameter until the desired number of clusters is produced. The subtype estimates may be refined over a sequence of iterations of the above procedure, making the algorithm iterative as illustrated in FIG. 10.

According to a specific embodiment, the clustering algorithm calculates subtype assignments for a type given subtype assignments for each parent type and estimated subtype counts for each child type. The algorithm receives as input a (possibly maximal) set of subtypes of a type and subtype count approximations for each child cell type. The output is a new subtyping which groups together sets of input types. According to a more specific embodiment, in order to make sure that the required information about a parent is available for each type, the algorithm traverses the type lattice in such a way that a type is always encountered before its children, building up a set of subtype assignments along the way. For example, an arbitrary total ordering may be imposed on the types which preserves a partial ordering defined by the child cell relationship, i.e., a topological sort.

The following is some exemplary pseudo-code corresponding to such an approach. The cost calculations will be explained in more detail below.

```
(map of old subtype -> new subtype)
    partition(t : type, s: old subtypes,
            subtype-est : type -> est. subtype count (int))
{
    for (i=1; ; i++) {
        try to group s into i partitions
        calculate gain of the clustering
        if (gain increase) / (layout cost increase) <= w/p {
            return previous partitioning
        }
    }
}
(map of instance class -> subtype)
    compute_subtypes(types, subtypes : subtype -> type,
            subtype_est : type -> est. subtype count(int))
{
    list 1 = topological sort of types from parent to child
    map result;
    for t in 1 {
        g = compute instance classes of t
        h = partition(t, g, subtype_est)
        update subtype_est
        result.addAll(h);
    }
    return result;
}
```

According to a particular implementation, the approximate gain function needed by partition may be computed with data from a separate sizing run on the instance classes of a type. For example, it could be assumed that all the instances of a subtype will be given the size of the instance which had the maximum size in the test run. Another possibility is to estimate the gain by using some notion of distance between two instances of a class based on the capacitive environments of their exterior ports.

The partition () function may use the subtype count estimates in a variety of ways to make the gain calculation more accurate. For example, the gain of a partitioning of the instance classes of a particular type could be calculated by adding the estimated contributions from each of the child cells of that type. In such an approach, if a child cell type is not expected to have as many subtypes as its parent type, then not every block of the partition will be allowed its own version of the child cell, so the contribution of the child cell in the gain calculation may be correspondingly reduced.

The role of the cost and profit calculations for specific implementations will now be further described. The top-down partitioning method described above is general enough that some other heuristic may be employed to decide how many partitions to make. Alternatively, it is possible to treat each of the partitioning decisions as a node in a decision tree, and to search the space of subtyping solutions by exploring multiple paths from the root. Or, the approaches may be combined, using the profit function to guide a branch-and-bound exploration of the solution space.

Alternatively, a simple greedy algorithm may be employed to guide the partitioning of each node. According to a specific embodiment, decision making in such a greedy algorithm is based on a profit function which is derived directly from the trade-offs involved in creating subtypes. Initially considering the case where there is only one type (and with the understanding that the grouping is performed for each type), it is assumed that there are a fixed amount of resources l required to layout and verify each subtype of that type. The layout cost is l times the layout "wage" w (which is used to control the number of subtypes created and need not reflect any actual salary). Let $f(x)$ be the area saved by creating x subtypes, and let p be the "money" we save for each unit of area. In addition, functions in the form $\partial g/\partial y$ are abbreviated $g_y$. Then the profit as a function of the number of subtypes x is $$\pi = pf(x) - wlx \qquad (2)$$

and the marginal profit for each additional subtype is $$\pi_x = pf_x - wl \qquad (3)$$

or rewriting $$\pi_x/pl = f_x/l - w/p \qquad (4)$$

Note that p and w are positive, so when $f_x/l > w/p$, an increase in x should increase $\pi$. We can use this to find a value $x^*$ of x which maximizes $\pi$. increase x until $f_x/l \leq w/p$ holds. Since $f$ is convex and monotonically increasing, this identifies the unique maximizer $x^*$ of $\pi(x)$.

These equations may be generalized to more than one type:

$$\pi(x) = pf(x) - wl \cdot x \qquad (5)$$

For a given type T, we have:

$$\pi_{xT}(x)/pl_{xT} = f_{xT}(x)/l_{xT} - w/p \qquad (6)$$

Our test then becomes:

$$f_{xT}/l_{xT} \leq w/p \qquad (7)$$

This is what is used in the partition ( ) function. Notice that w/p does not depend on T. This is convenient because it means that $f_{xT}/l_{xT}$ can be used to compare the relative benefits of two subtype decisions. This could be used to sort the output subtypes, or to decide how to adjust $l_{xT}$ to increase or reduce the number of subtypes of T which are created.

The foregoing method for computing a subtyping solution approximately maximizes profit $\pi$ given appropriate values of layout wage w and area price p. However, being able to control the value w may not be usefull for all applications. Therefore, specific embodiments of the invention control subtype creation with reference to a maximum layout expenditure L. That is, given the maximum layout cost L, the area gain is maximized subject to the constraint that the layout demand D (i.e., the total layout cost of all the subtypes that are created) be less than L. This maximization can simply be repeated for different values of w until D falls below L. Although this might sound time-consuming, if a good solver (e.g., Newton's method) is used, then only a few iterations should be required. A more sophisticated solver (e.g., one specifically adapted to this problem) should do even better. According to specific embodiments, the old value of w can be cached and used as an initial condition in successive runs of the program.

It should also be noted that the subtype count estimates of child types used to determine how the parents are subtyped may turn out to be significantly different than the actual count when subtype assignments of those child instances are actually computed. For example, two subtypes of a parent cell might be created under the assumption that each one will be allowed separate child subtypes. However, the computation for the child cells might find that creating more than one subtype of each child is not worthwhile. More specifically, a cell A might have several "border" children $B_i$. Each $B_i$ might contribute some small area gain if both A and $B_i$ were subtyped. The area gain achieved from creating two subtypes of A would be the sum of all these gains, which might be high enough to warrant subtyping A. However, if only one subtype is created of $B_i$ for most i, the area saved by subtyping A might then turn out to be too small to justify the resulting cost.

Therefore, according to a specific embodiment, the subtypes computation is first run with subtype count estimates of $\infty$ for every type. This corresponds to the assumption that each cell which is subtyped will be able to use as many child subtypes as necessary to get the predicted area gain. This will result in a first set of subtype assignments. The subtypes computation may then be re-run using these data for the new subtype count estimates. This could be iterated until the results from successive trials were sufficiently similar. Upon achieving convergence, and because the last trial would (by definition) have employed correct subtype count estimates in every decision, the resulting solution should be one that minimizes $\pi$. According to an alternative embodiment, the subtype count estimates for each successive iteration are updated with a weighted average of the new results and the last predictions rather than just setting them equal to the new results.

With these variations, an exemplary implementation of a subtyping algorithm according to the present invention may be provided as follows:

```
E - initial subtype count estimate of infinity
I - original instance types
S - new instance subtypes
solve for D(w)<L {
    loop until convergence in E {
        // compute subtypes for I with count estimates E
        // and layout wage w
        S = compute_subtypes(I,E,w)
        // update estimates
        E = subtype counts of instances in S
    }
    D(w) = layout cost of S
}
```

According to an alternative embodiment, the two loops may be combined so that w is adjusted simultaneously with E.

While the invention has been particularly shown and described with reference to specific embodiments thereof, it will be understood by those skilled in the art that changes in the form and details of the disclosed embodiments may be made without departing from the spirit or scope of the invention. For example, the processes described herein and the resulting circuits may be represented (without limitation) in software (object code or machine code), in varying stages of compilation, as one or more netlists, in a simulation language, in a hardware description language, by a set of semiconductor processing masks, and as partially or completely realized semiconductor devices. The various alternatives for each of the foregoing as understood by those of skill in the art are also within the scope of the invention. For example, the various types of computer-readable media, software languages (e.g., Verilog, VHDL), simulatable representations (e.g., SPICE netlist), semiconductor processes (e.g., CMOS, GaAs, SiGe, etc.), and device types (e.g., FPGAs) suitable for using in conjunction with the processes described herein are within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A computer-implemented method for facilitating physical synthesis of a circuit design, the circuit design comprising a plurality cell instances organized hierarchically, each cell instance corresponding schematically to one of a plurality of cell types, the method comprising:
   sizing transistors in each of the cell instances with reference to an objective function thereby resulting in a first plurality of cell subtypes for each cell type, each cell subtype corresponding to a particular cell type differing from all other cell subtypes corresponding to the particular cell type by at least one transistor dimension; and
   merging selected ones of the subtypes for at least one of the cell types thereby resulting in a second plurality of subtypes for the at least one of the cell types, the second plurality of subtypes being fewer than the first plurality of subtypes, wherein merging of the selected subtypes achieves a balance between the objective function and a cost associated with maintaining the selected subtypes distinct.

2. The method of claim 1 further comprising partitioning the cell instances for each cell type into at least one instance class, the cell instances in each instance class having a same relationship to an immediate parent cell, each instance class corresponding to one of the first plurality of subtypes.

3. The method of claim 2 wherein the partitioning of the cell instances is performed with reference to at least one user-defined constraint.

4. The method of claim 2 wherein the partitioning of cell instances is performed prior to the sizing of the transistors.

5. The method of claim 2 wherein the partitioning of cell instances is performed after the sizing of the transistors.

6. The method of claim 2 wherein the merging of the selected subtypes is performed with reference to the instance classes.

7. The method of claim 1 wherein the circuit design corresponds to an asynchronous circuit.

8. The method of claim 1 wherein the circuit design corresponds to a synchronous circuit.

9. The method of claim 1 wherein the merging of the selected subtypes is performed with reference to a distance function which represents a distance between two of the selected subtypes in a metric space which relates the objective function and the cost.

10. The method of claim 9 wherein the distance function comprises a plurality of components which includes any of a layout cost corresponding to the selected subtypes, a number of instances of each of the selected subtypes, transistor sizes for the selected subtypes, estimated transistor sizes for a merged subtype, external resistive loads for the selected subtypes, and external capacitive loads for the selected subtypes.

11. The method of claim 9 wherein a decision to merge the selected subtypes is made by comparing the distance between the two selected subtypes to a threshold value.

12. The method of claim 11 wherein the threshold value represents a tradeoff between the objective function and the cost.

13. The method of claim 12 further comprising adjusting the threshold value to change the balance between the objective function and the cost.

14. The method of claim 11 wherein at least one of the selected subtypes corresponds to a fixed-size subtype, the threshold value to which the distance between the fixed-size subtype and others of the selected subtypes is compared being different than the threshold value employed for comparisons among the other selected subtypes.

15. The method of claim 1 wherein the objective function comprises at least one of area and power dissipation.

16. The method of claim 1 wherein the cost comprises at least one of a layout cost which represents at least one layout resource required to lay out a cell corresponding to the at least one cell type, and a verification cost which represents at least one verification resource required to test a cell corresponding to the at least one cell type.

17. The method of claim 1 wherein the merging of the selected subtypes is performed with reference to at least one internal characteristic of the selected subtypes.

18. The method of claim 17 wherein the at least one internal characteristic comprises transistor sizes.

19. The method of claim 1 wherein the merging of the selected subtypes is performed with reference to at least one external characteristic of the selected subtypes.

20. The method of claim 19 wherein the at least one external characteristic comprises at least one of external resistive loads for the selected subtypes, and external capacitive loads for the selected subtypes.

21. The method of claim 1 further comprising, prior to sizing the transistors, partitioning the cell instances for each cell type into the first plurality of subtypes.

22. The method of claim 21 wherein the partitioning of the cell instances comprises making subtype assignments for parent cell instances on a first level of a hierarchy of the circuit design with reference to a number of parent cell subtypes, and estimated subtype counts for child cell instances in the parent cell instances on at least one other level of the hierarchy below the first level.

23. The method of claim 22 wherein each of the subtype assignments for the parent cell instances is made with reference to a profit function representing a profit corresponding to the subtype assignment.

24. The method of claim 23 wherein the profit function relates an area gain for a given number of subtypes for the parent cell instances to a layout cost associated with the given number of subtypes.

25. The method of claim 21 wherein the circuit design corresponds to a hierarchy having a word level, and wherein partitioning the cells instances for each cell type into the first plurality of subtypes comprises partitioning all cell instances corresponding to the word level and any level of the hierarchy below the word level.

26. The method of claim 25 further wherein cell instances contained in arrays are excluded from the partitioning.

27. The method of claim 1 further comprising mapping the first plurality of subtypes into a metric space which relates the objective function and the cost.

28. The method of claim 27 further comprising weighting each of the first plurality of subtypes in accordance with a number of the cell instances corresponding thereto.

29. The method of claim 1 wherein the sizing of the transistors comprises:

generating a set of paths between observable nodes in a netlist representing the circuit design, each path corresponding to a sequence of signal transitions; and sizing transistors represented in the netlist to attempt to meet a delay constraint for each path, the delay constraint corresponding to a unit delay times the number of signal transitions in the corresponding path, a plurality of individual delays of different durations being allocated among the transitions for at least one of the paths to meet the delay constraint, at least one of the individual delays exceeding the unit delay.

30. An integrated circuit embodying the physical synthesis facilitated according to the method of claim 1.

31. At least one computer readable medium having data structures stored therein representing a sized netlist corresponding to the physical synthesis facilitated according to the method of claim 1.

32. A set of semiconductor processing masks generated using a sized netlist corresponding to the physical synthesis facilitated according to the method of claim 1.

33. At least one computer-readable medium having computer program instructions stored therein which are operable to perform the method of claim 1.

34. An electronic system comprising at least one integrated circuit embodying the physical synthesis facilitated according to the method of claim 1.

* * * * *